(12) United States Patent
Harris et al.

(10) Patent No.: US 9,714,379 B2
(45) Date of Patent: Jul. 25, 2017

(54) HIGHLY LUMINESCENT SEMICONDUCTOR NANOCRYSTALS

(71) Applicant: MASSACHUSETTS INSTITUTE OF TECHNOLOGY, Cambridge, MA (US)

(72) Inventors: Daniel Harris, Wilton, CT (US); Moungi G. Bawendi, Cambridge, MA (US)

(73) Assignee: MASSACHUSETTS INSTITUTE OF TECHNOLOGY, Cambridge, MA (US)

( * ) Notice: Subject to any disclaimer, the term of this patent is extended or adjusted under 35 U.S.C. 154(b) by 0 days.

(21) Appl. No.: 14/887,996

(22) Filed: Oct. 20, 2015

(65) Prior Publication Data

US 2016/0200971 A1   Jul. 14, 2016

Related U.S. Application Data

(63) Continuation of application No. 13/617,932, filed on Sep. 14, 2012, now Pat. No. 9,162,882.

(60) Provisional application No. 61/535,597, filed on Sep. 16, 2011.

(51) Int. Cl.
| | | |
|---|---|---|
| *C09K 11/74* | (2006.01) | |
| *H01L 21/02* | (2006.01) | |
| *B82Y 20/00* | (2011.01) | |
| *H01L 31/0232* | (2014.01) | |
| *B82Y 30/00* | (2011.01) | |
| *C09K 11/62* | (2006.01) | |
| *C09K 11/66* | (2006.01) | |
| *B82Y 40/00* | (2011.01) | |

(52) U.S. Cl.
CPC .......... *C09K 11/7492* (2013.01); *B82Y 20/00* (2013.01); *B82Y 30/00* (2013.01); *C09K 11/62* (2013.01); *C09K 11/66* (2013.01); *C09K 11/74* (2013.01); *H01L 21/024* (2013.01); *H01L 21/02521* (2013.01); *H01L 21/02601* (2013.01); *H01L 21/02628* (2013.01); *H01L 31/02322* (2013.01); *B82Y 40/00* (2013.01)

(58) Field of Classification Search
None
See application file for complete search history.

(56) References Cited

U.S. PATENT DOCUMENTS 9,162,882 B2 * 10/2015 Harris ............... H01L 21/024
2005/0266246 A1   12/2005 Reiss et al.
2011/0097879 A1   4/2011 Reiss et al.

FOREIGN PATENT DOCUMENTS

| KR | 10-2006-0035568 | 4/2006 |
| KR | 10-2006-0050750 | 5/2006 |
| KR | 10-2010-0054482 | 5/2010 |

OTHER PUBLICATIONS

International Search Report; PCT/US2012/055432; mailed Mar. 4, 2013.

* cited by examiner

*Primary Examiner* — Asok K Sarkar
(74) *Attorney, Agent, or Firm* — Steptoe & Johnson LLP

(57) ABSTRACT

A method of making a semiconductor nanocrystal can include contacting an M-containing compound with an X donor having the formula $X(Y(R)_3)_3$, where X is a group V element and Y is a group IV element.

8 Claims, 9 Drawing Sheets

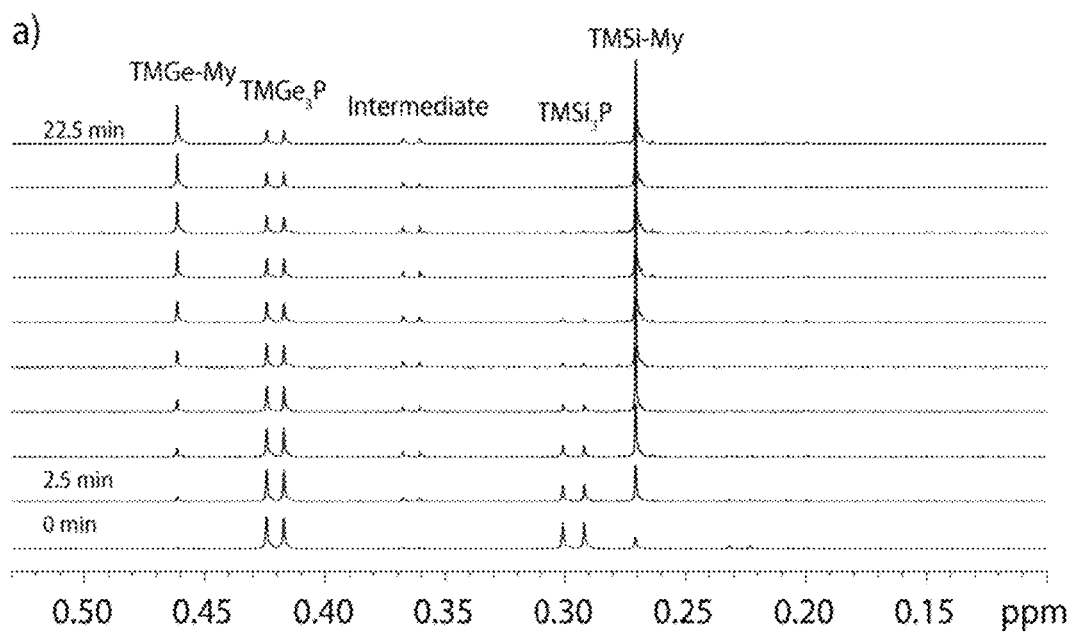
FIG. 8A
FIG. 8B
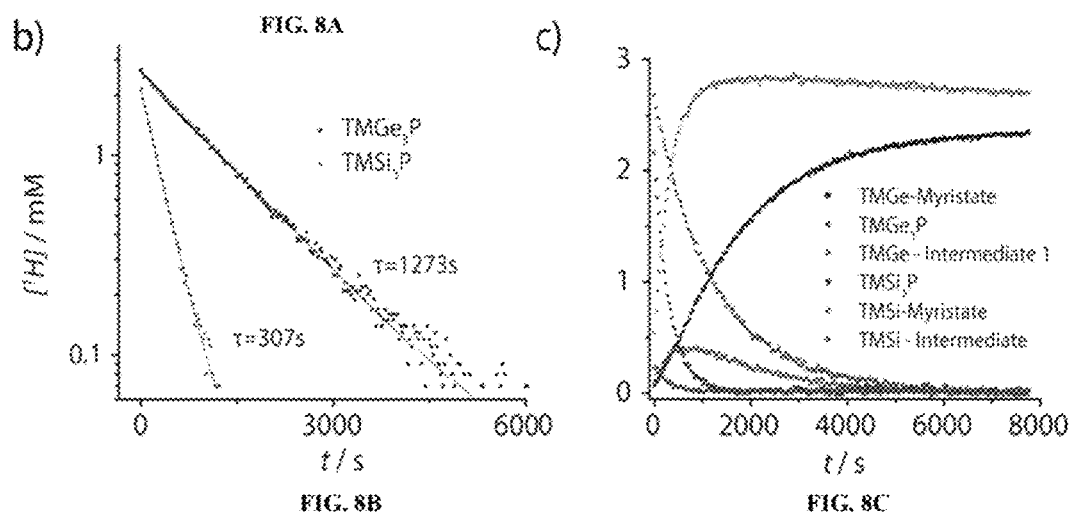
FIG. 8C

HIGHLY LUMINESCENT SEMICONDUCTOR NANOCRYSTALS

CLAIM OF PRIORITY

This application is a continuation of claims U.S. application Ser. No. 13/617,932, filed Sep. 14, 2012, which claims priority to U.S. Provisional Application Ser. No. 61/535,597, filed Sep. 16, 2011, each of which is incorporated by reference in its entirety.

STATEMENT REGARDING FEDERALLY SPONSORED RESEARCH OR DEVELOPMENT

This invention was made with government support under Grant No. HR0011-10-C-0081 awarded by the Defense Advanced Research Projects Agency. The government has certain rights in this invention.

TECHNICAL FIELD

This invention relates to highly luminescent semiconductor nanocrystals and methods of making and using them.

BACKGROUND

Semiconductor nanocrystals are a powerful class of nanostructures that exhibit high photoluminescence quantum yields, large molar extinction coefficients, high photostability compared to typical molecular fluorophores, and size-tunable emission wavelengths that can extend across the visible and near-IR spectral range. These properties make semiconductor nanocrystals useful in applications including biological fluorescent tags and light-emitting devices, among others.

Nanocrystals having small dimensions can have properties intermediate between molecular and bulk forms of matter. For example, nanocrystals of semiconductor materials having sufficiently small dimensions can exhibit quantum confinement of excitons (excited state electron-hole pair) in all three dimensions. Quantum confinement leads to an increase in the effective band gap of the material with decreasing crystallite size. Consequently, both the optical absorption and emission of nanocrystals shift to the blue (i.e., to higher energies) as the size of the nanocrystal decreases.

The quantum efficiency of emission from nanocrystals having a core of a first semiconductor material can be enhanced by applying an overcoating of a second semiconductor material such that the conduction band of the second semiconductor material is of higher energy than that of the first semiconductor material, and the valence band of the second semiconductor material is of lower energy than that of the first semiconductor material. As a result, both charge carriers of an exciton, i.e., electrons and holes, are confined in the core of the nanocrystal.

SUMMARY

Semiconductor nanocrystals have size-dependent optical and electronic properties. In particular, the band gap energy of a semiconductor nanocrystal of a particular semiconductor material varies with the diameter of the crystal. Generally, a semiconductor nanocrystal is a member of a population of nanocrystals having a distribution of sizes. When the distribution is centered about a single value and narrow, the population can be described as monodisperse. Monodisperse particles can be defined as having at least 60% of the particles fall within a specified particle size range. Monodisperse particles can deviate less in their diameters less than 10% rms and preferably less than 5% rms.

Many applications of semiconductor nanocrystals depend on their photoluminescent properties. Accordingly, semiconductor nanocrystals having narrow emission linewidths (expressed, for example, as a full width at half max) and high quantum yields are desirable.

Semiconductor nanocrystals containing pnictides (group V elements) are among the most challenging to synthesize. Nevertheless, pnictide containing nanocrystals are an area of intense interest for cadmium-free nanocrystals that emit visible wavelengths and for nanocrystals that emit in the infrared. Infrared-emitting nanocrystals can be useful in devices such as solar cells and photodetectors. A longstanding challenge for the III-V nanocrystals (e.g., indium arsenide nanocrystals) has been the synthesis of large particles, particularly with narrow size distributions.

In one aspect, a method of making a semiconductor nanocrystal includes contacting an M-containing compound with an X donor, wherein the X donor has formula (I):

$$X(Y(R)_3)_3 \qquad (I)$$

where X is a group V element; Y is Ge, Sn, or Pb; and each R, independently, is alkyl, alkenyl, alkynyl, cycloalkyl, cycloalkenyl, heterocyclyl, aryl, or heteroaryl, wherein each R, independently, is optionally substituted by 1 to 6 substituents independently selected from hydrogen, halo, hydroxy, nitro, cyano, amino, alkyl, cycloalkyl, cycloalkenyl, alkoxy, acyl, thio, thioalkyl, alkenyl, alkynyl, cycloalkenyl, heterocyclyl, aryl, or heteroaryl.

In some embodiments, X can be N, P, As, or Sb. Y can be Ge. Each R, independently, can be alkyl, cycloalkyl, or aryl. Each R, independently, can be unsubstituted alkyl, unsubstituted cycloalkyl, or unsubstituted aryl. The M-containing compound can be an M-containing salt. M can be a group III element. M can be In.

The compound of formula (I) can be tris(trimethylgermyl) nitride; tris(trimethylstannyl)nitride; tris(trimethylplumbyl)nitride; tris(trimethylgermyl)phosphide; tris(trimethylstannyl) phosphide; tris(trimethylplumbyl) phosphide; tris(trimethylgermyl)arsine; tris(trimethylstannyl)arsine; tris(trimethylplumbyl)arsine; tris(trimethylgermyl)stibine; tris(trimethylstannyl)stibine; or tris(trimethylplumbyl)stibine.

In another aspect, a method of making a semiconductor nanocrystal, includes contacting an M-containing salt with an X donor, wherein the X donor has formula (I):

$$X(Y(R)_3)_3 \qquad (I)$$

where X is P, As, or Sb; Y is Ge, Sn or Pb; each R, independently, is unsubstituted alkyl or unsubstituted cycloalkyl; and M is a group III element.

In some embodiments, X can be As or Sb. Y can be Ge. M can be In. The compound of formula (I) can be tris(trimethylgermyl)arsine; tris(trimethylstannyl)arsine; tris(trimethylplumbyl)arsine; tris(trimethylgermyl)stibine; tris(trimethylstannyl)stibine; or tris(trimethylplumbyl)stibine.

In some embodiments, X is P or As; Y is Ge; M is In; and each R, independently, is unsubstituted alkyl.

Other aspects, embodiments, and features will be apparent from the following description, the drawings, and the claims.

BRIEF DESCRIPTION OF THE DRAWINGS

FIG. 8a shows a time series of NMR spectra showing simultaneous reaction of TMSi$_3$P and TMGe$_3$P with 2.5 mM InMy$_3$. FIG. 8b shows integrated peak area for TMSi$_3$P and TMGe$_3$P normalized and plotted on a semilog plot. FIG. 8c shows integrated peak areas normalized by total proton concentration associated with the corresponding TME-peaks.

DETAILED DESCRIPTION

Figure 1:
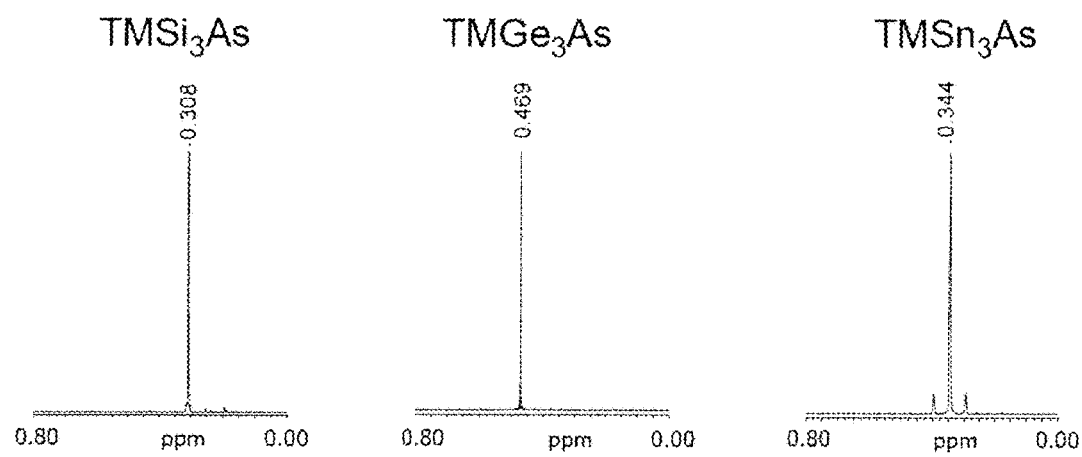
FIG. 1 shows $^1$H NMR spectra of arsine nanocrystal precursors.

Semiconductor nanocrystals demonstrate quantum confinement effects in their luminescent properties. When semiconductor nanocrystals are illuminated with a primary energy source, a secondary emission of energy occurs at a frequency that relates to the band gap of the semiconductor material used in the nanocrystal. In quantum confined particles, the frequency is also related to the size of the nanocrystal.

Core-shell heterostructures have been widely explored as a means to adjust the photophysical properties of semiconductor nanocrystals, and can be used to increase their brightness as fluorophores in two ways: (1) maximizing the photoluminescence (PL) quantum yield (QY) through electronic and chemical isolation of the core from surface-associated recombination centers; and (2) increasing the excitation rate (absorption cross-section) by building a high density of electronic states at energies above the shell bandgap. These two roles for the shell present a potential trade-off in terms of shell material. A wide bandgap shell imposes large electronic barriers for carrier access to the surface but will be less able to contribute to absorption, while a narrower gap shell could participate in light harvesting but may make it harder to achieve high QY.

In general, the method of manufacturing a nanocrystal is a colloidal growth process. See, for example, U.S. Pat. Nos. 6,322,901 and 6,576,291, and U.S. patent application Ser. No. 12/862,195, filed Aug. 24, 2010, each of which is incorporated by reference in its entirety. Colloidal growth can result when an M-containing compound and an X donor are rapidly injected into a hot coordinating solvent. The coordinating solvent can include an amine. The M-containing compound can be a metal, an M-containing salt, or an M-containing organometallic compound. The injection produces a nucleus that can be grown in a controlled manner to form a nanocrystal. The reaction mixture can be gently heated to grow and anneal the nanocrystal. Both the average size and the size distribution of the nanocrystals in a sample are dependent on the growth temperature. The growth temperature necessary to maintain steady growth increases with increasing average crystal size. The nanocrystal is a member of a population of nanocrystals. As a result of the discrete nucleation and controlled growth, the population of nanocrystals obtained has a narrow, monodisperse distribution of diameters. The monodisperse distribution of diameters can also be referred to as a size. The process of controlled growth and annealing of the nanocrystals in the coordinating solvent that follows nucleation can also result in uniform surface derivatization and regular core structures. As the size distribution sharpens, the temperature can be raised to maintain steady growth. By adding more M-containing compound or X donor, the growth period can be shortened.

The M-containing salt can be a non-organometallic compound, e.g., a compound free of metal-carbon bonds. M can be cadmium, zinc, magnesium, mercury, aluminum, gallium, indium, thallium, or lead. The M-containing salt can be a metal halide, metal carboxylate, metal carbonate, metal hydroxide, metal oxide, or metal diketonate, such as a metal acetylacetonate. The M-containing salt is less expensive and safer to use than organometallic compounds, such as metal alkyls. For example, the M-containing salts are stable in air, whereas metal alkyls are generally unstable in air. M-containing salts such as 2,4-pentanedionate (i.e., acetylacetonate (acac)), halide, carboxylate, hydroxide, oxide, or carbonate salts are stable in air and allow nanocrystals to be manufactured under less rigorous conditions than corresponding metal alkyls. In some cases, the M-containing salt can be a long-chain carboxylate salt, e.g., a $C_8$ or higher (such as $C_8$ to $C_{20}$, or $C_{12}$ to $C_{18}$), straight chain or branched, saturated or unsaturated carboxylate salt. Such salts include, for example, M-containing salts of lauric acid, myristic acid, palmitic acid, stearic acid, arachidic acid, palmitoleic acid, oleic acid, linoleic acid, linolenic acid, or arachidonic acid.

Suitable M-containing salts include cadmium acetylacetonate, cadmium iodide, cadmium bromide, cadmium chloride, cadmium hydroxide, cadmium carbonate, cadmium acetate, cadmium myristate, cadmium oxide, zinc acetylacetonate, zinc iodide, zinc bromide, zinc chloride, zinc hydroxide, zinc carbonate, zinc acetate, zinc myristate, zinc oxide, magnesium acetylacetonate, magnesium iodide, magnesium bromide, magnesium chloride, magnesium hydroxide, magnesium carbonate, magnesium acetate, magnesium myristate, magnesium oxide, mercury acetylacetonate, mercury iodide, mercury bromide, mercury chloride, mercury hydroxide, mercury carbonate, mercury acetate, mercury myristate, aluminum acetylacetonate, aluminum iodide, aluminum bromide, aluminum chloride, aluminum hydroxide, aluminum carbonate, aluminum acetate, aluminum myristate, gallium acetylacetonate, gallium iodide, gallium bromide, gallium chloride, gallium hydroxide, gallium carbonate, gallium acetate, gallium myristate, indium acetylacetonate, indium iodide, indium bromide, indium chloride, indium hydroxide, indium carbonate, indium acetate, indium myristate, thallium acetylacetonate, thallium iodide, thallium bromide, thallium chloride, thallium hydroxide, thallium carbonate, thallium acetate, or thallium myristate.

Prior to combining the M-containing salt with the X donor, the M-containing salt can be contacted with a coordinating solvent to form an M-containing precursor. Typical coordinating solvents include alkyl phosphines, alkyl phosphine oxides, alkyl phosphonic acids, or alkyl phosphinic acids; however, other coordinating solvents, such as pyridines, furans, and amines may also be suitable for the nanocrystal production. Examples of suitable coordinating solvents include pyridine, tri-n-octyl phosphine (TOP) and tri-n-octyl phosphine oxide (TOPO). Technical grade TOPO can be used. The coordinating solvent can include a 1,2-diol or an aldehyde. The 1,2-diol or aldehyde can facilitate reaction between the M-containing salt and the X donor and improve the growth process and the quality of the nanocrystal obtained in the process. The 1,2-diol or aldehyde can be a $C_6$-$C_{20}$ 1,2-diol or a $C_6$-$C_{20}$ aldehyde. A suitable 1,2-diol is 1,2-hexadecanediol or myristol and a suitable aldehyde is dodecanal is myristic aldehyde.

The X donor is a compound capable of reacting with the M-containing salt to form a material with the general formula MX. Typically, the X donor is a chalcogenide donor or a pnictide donor, such as a phosphine chalcogenide, a bis(silyl) chalcogenide, dioxygen, an ammonium salt, or a tris(silyl) pnictide. Suitable X donors include dioxygen, elemental sulfur, bis(trimethylsilyl) selenide (($TMS)_2Se$), trialkyl phosphine selenides such as (tri-n-octylphosphine) selenide (TOPSe) or (tri-n-butylphosphine) selenide (TBPSe), trialkyl phosphine tellurides such as (tri-n-octylphosphine) telluride (TOPTe) or hexapropylphosphorustriamide telluride (HPPTTe), bis(trimethylsilyl)telluride (($TMS)_2Te$), sulfur, bis(trimethylsilyl)sulfide (($TMS)_2S$), a trialkyl phosphine sulfide such as (tri-n-octylphosphine) sulfide (TOPS), tris(dimethylamino) arsine, an ammonium salt such as an ammonium halide (e.g., $NH_4Cl$), tris(trimethylsilyl) phosphide (($TMS)_3P$), tris(trimethylsilyl) arsenide (($TMS)_3As$), or tris(trimethylsilyl) antimonide (($TMS)_3Sb$). In certain embodiments, the M donor and the X donor can be moieties within the same molecule.

The X donor can be a compound of formula (I):

$$X(Y(R)_3)_3 \tag{I}$$

where X is a group V element, Y is a group IV element, and each R, independently, is alkyl, alkenyl, alkynyl, cycloalkyl, cycloalkenyl, heterocyclyl, aryl, or heteroaryl, where each R, independently, is optionally substituted by 1 to 6 substituents independently selected from hydrogen, halo, hydroxy, nitro, cyano, amino, alkyl, cycloalkyl, cycloalkenyl, alkoxy, acyl, thio, thioalkyl, alkenyl, alkynyl, cycloalkenyl, heterocyclyl, aryl, or heteroaryl.

In some embodiments, X can be N, P, As, or Sb. Y can be C, Si, Ge, Sn, or Pb. Each R, independently, can be alkyl, cycloalkyl, or aryl. In some cases, each R, independently, can be unsubstituted alkyl, unsubstituted cycloalkyl, or unsubstituted aryl; for example, a $C_1$ to $C_8$ unsubstituted alkyl, a $C_3$ to $C_8$ unsubstituted cycloalkyl, or a $C_6$ unsubstituted aryl (e.g., phenyl). In some embodiments, X can be P, As, or Sb. In some embodiments, Y can be Ge, Sn, or Pb.

In some embodiments, X can be P, As, or Sb, Y can be Ge, Sn, or Pb, and each R, independently, can be unsubstituted alkyl, unsubstituted cycloalkyl, or unsubstituted aryl; for example, a $C_1$ to $C_8$ unsubstituted alkyl, a $C_3$ to $C_8$ unsubstituted cycloalkyl, or a $C_6$ unsubstituted aryl (e.g., phenyl). Each R, independently, can be unsubstituted alkyl, for example, a $C_1$ to $C_6$ unsubstituted alkyl.

Alkyl is a branched or unbranched saturated hydrocarbon group of 1 to 30 carbon atoms, such as methyl, ethyl, n-propyl, isopropyl, n-butyl, isobutyl, t-butyl, octyl, decyl, tetradecyl, hexadecyl, eicosyl, tetracosyl and the like. Optionally, an alkyl group can be substituted by 1 to 6 substituents independently selected from hydrogen, halo, hydroxy, nitro, cyano, amino, alkyl, cycloalkyl, cycloalkenyl, alkoxy, acyl, thio, thioalkyl, alkenyl, alkynyl, cycloalkenyl, heterocyclyl, aryl, or heteroaryl. Optionally, an alkyl group can contain 1 to 6 linkages selected from —O—, —S—, -M- and —NR— where R is hydrogen, or $C_1$-$C_8$ alkyl or lower alkenyl. Cycloalkyl is a cyclic saturated hydrocarbon group of 3 to 10 carbon atoms, such as cyclopropyl, cyclobutyl, cyclopentyl, cyclohexyl, cycloheptyl, cyclooctyl, and the like. A cycloalkyl group can be optionally substituted, or contain linkages, as an alkyl group does.

Alkenyl is a branched or unbranched unsaturated hydrocarbon group of 2 to 20 carbon atoms containing at least one double bond, such as vinyl, propenyl, butenyl, and the like. Cycloalkenyl is a cyclic unsaturated hydrocarbon group of 3 to 10 carbon atoms including at least one double bond. An alkenyl or cycloalkenyl group can be optionally substituted, or contain linkages, as an alkyl group does.

Alkynyl is a branched or unbranched unsaturated hydrocarbon group of 2 to 20 carbon atoms containing at least one triple bond, such as ethynyl, propynyl, butynyl, and the like. An alkynyl group can be optionally substituted, or contain linkages, as an alkyl group does.

Heterocyclyl is a 3- to 10-membered saturated or unsaturated cyclic group including at least one ring heteroatom selected from O, N, or S. A heterocylyl group can be optionally substituted, or contain linkages, as an alkyl group does.

Aryl is a 6- to 14-membered carbocyclic aromatic group which may have one or more rings which may be fused or unfused. In some cases, an aryl group can include an aromatic ring fused to a non-aromatic ring. Exemplary aryl groups include phenyl, naphthyl, or anthracenyl. Heteroaryl is a 6- to 14-membered aromatic group which may have one or more rings which may be fused or unfused. In some cases, a heteroaryl group can include an aromatic ring fused to a non-aromatic ring. An aryl or heteroaryl group can be optionally substituted, or contain linkages, as an alkyl group does.

Examples of X donors of formula (I) include: tris(trimethylgermyl)nitride, $N(Ge(CH_3)_3)_3$; tris(trimethylstannyl) nitride, $N(Sn(CH_3)_3)_3$; tris(trimethylplumbyl)nitride, $N(Pb(CH_3)_3)_3$; tris(trimethylgermyl)phosphide, $P(Ge(CH_3)_3)_3$; tris(trimethylstannyl) phosphide, $P(Sn(CH_3)_3)_3$; tris(trimethylplumbyl) phosphide, $P(Pb(CH_3)_3)_3$; tris(trimethylgermyl)arsine, $As(Ge(CH_3)_3)_3$; tris(trimethylstannyl)arsine, $As(Sn(CH_3)_3)_3$; tris(trimethylplumbyl)arsine, $As(Pb(CH_3)_3)_3$; tris(trimethylgermyl)stibine, $Sb(Ge(CH_3)_3)_3$; tris(trimethylstannyl)stibine, $Sb(Sn(CH_3)_3)_3$; and tris(trimethylplumbyl)stibine, $Sb(Pb(CH_3)_3)_3$.

For given values of X and R, varying Y can produce X donors having varying reactivity, e.g., different reaction kinetics in the formation of semiconductor nanocrystals. Thus, the reactivity of tris(trimethylsilyl)arsine in the formation of nanocrystals can be different from the reactivity of tris(trimethylstannyl)arsine or tris(trimethylplumbyl)arsine in an otherwise similar reaction. Likewise, for given values of X and Y, variations in R can produce variations in reactivity. In the formation of nanocrystals, reactivity (and particularly reaction kinetics) can affect the size and size distribution of the resulting population of nanocrystals. Thus, selection of precursors having appropriate reactivity can aid in forming a population of nanocrystals having desirable properties, such as a particular desired size and/or a narrow size distribution.

The nanocrystal manufactured from an M-containing salt can grow in a controlled manner when the coordinating solvent includes an amine. The amine in the coordinating solvent can contribute to the quality of the nanocrystal obtained from the M-containing salt and X donor. Preferably, the coordinating solvent is a mixture of the amine and an alkyl phosphine oxide. The combined solvent can decrease size dispersion and can improve photoluminescence quantum yield of the nanocrystal. The preferred amine is a primary alkyl amine or a primary alkenyl amine, such as a $C_2$-$C_{20}$ alkyl amine, a $C_2$-$C_{20}$ alkenyl amine, preferably a $C_8$-$C_{18}$ alkyl amine or a $C_8$-$C_{18}$ alkenyl amine. For example, suitable amines for combining with tri-octylphosphine oxide (TOPO) include 1-hexadecylamine, or oleylamine. When the 1,2-diol or aldehyde and the amine are used in combination with the M-containing salt to form a population of nanocrystals, the photoluminescence quantum efficiency and the distribution of nanocrystal sizes are improved in comparison to nanocrystals manufactured without the 1,2-diol or aldehyde or the amine.

The nanocrystal can be a member of a population of nanocrystals having a narrow size distribution. The nanocrystal can be a sphere, rod, disk, or other shape. The nanocrystal can include a core of a semiconductor material. The nanocrystal can include a core having the formula MX, where M is cadmium, zinc, magnesium, mercury, aluminum, gallium, indium, thallium, or mixtures thereof, and X is oxygen, sulfur, selenium, tellurium, nitrogen, phosphorus, arsenic, antimony, or mixtures thereof.

The emission from the nanocrystal can be a narrow Gaussian emission band that can be tuned through the complete wavelength range of the ultraviolet, visible, or infrared regions of the spectrum by varying the size of the nanocrystal, the composition of the nanocrystal, or both. For example, both CdSe and CdS can be tuned in the visible region and InAs can be tuned in the infrared region.

A population of nanocrystals can have a narrow size distribution. The population can be monodisperse and can exhibit less than a 15% rms deviation in diameter of the nanocrystals, preferably less than 10%, more preferably less than 5%. Spectral emissions in a narrow range of between 10 and 100 nm full width at half max (FWHM) can be observed. Semiconductor nanocrystals can have emission quantum efficiencies (i.e., quantum yields, QY) of greater than 2%, 5%, 10%, 20%, 40%, 60%, 70%, 80%, or 90%. Semiconductor nanocrystals can have a QY of at least 90%, at least 91%, at least 92%, at least 93%, at least 94%, at least 95%, at least 96%, at least 97%, at least 97%, at least 98%, or at least 99%.

The semiconductor forming the core of the nanocrystal can include Group II-VI compounds, Group II-V compounds, Group III-VI compounds, Group III-V compounds, Group IV-VI compounds, Group compounds, Group II-IV-VI compounds, and Group II-IV-V compounds, for example, ZnS, ZnSe, ZnTe, CdS, CdSe, CdTe, HgS, HgSe, HgTe, AlN, AlP, AlAs, AlSb, GaN, GaP, GaAs, GaSb, GaSe, InN, InP, InAs, InSb, TlN, TlP, TlAs, TlSb, PbS, PbSe, PbTe, or mixtures thereof.

The quantum efficiency of emission from nanocrystals having a core of a first semiconductor material can be enhanced by applying an overcoating of a second semiconductor material such that the conduction band of the second semiconductor material is of higher energy than that of the first semiconductor material, and the valence band of the second semiconductor material is of lower energy than that of the first semiconductor material. As a result, charge carriers, i.e., electrons and holes, are confined in the core of the nanocrystal when in an excited state. Alternatively, the conduction band or valence band of overcoating material can have an energy intermediate between the energies of the conduction and valence bands of the core material. In this case, one carrier can be confined to the core while the other is confined to the overcoating material when in an excited state. See, for example, U.S. Pat. No. 7,390,568, which is incorporated by reference in its entirety. The core can have an overcoating on a surface of the core. The band gap of core and overcoating can have a desired band offset. In CdTe/CdSe (core/shell) nanocrystals, the conduction band of the shell is intermediate in energy to the valence band and conduction band of the core. CdTe/CdSe (core/shell) nanocrystals have lower potentials for the holes in the core and for the electrons in the shell. As a result, the holes can be mostly confined to the CdTe core, while the electrons can be mostly confined to the CdSe shell. CdSe/ZnTe (core/shell) nanocrystals have the valence band of the shell intermediate in energy to the valence band and conduction band of the core. As a result, the electrons reside mostly in the CdSe cores, while the holes reside mostly in the ZnTe shells. The overcoating can be a semiconductor material having a composition different from the composition of the core, and can have a band gap greater than the band gap of the core. The overcoat of a semiconductor material on a surface of the nanocrystal can include a Group II-VI compounds, Group II-V compounds, Group III-VI compounds, Group III-V compounds, Group IV-VI compounds, Group compounds, Group II-IV-VI compounds, and Group II-IV-V compounds, for example, ZnS, ZnSe, ZnTe, CdS, CdSe, CdTe, HgS, HgSe, HgTe, AlN, AlP, AlAs, AlSb, GaN, GaP, GaAs, GaSb, GaSe, InN, InP, InAs, InSb, TlN, TlP, TlAs, TlSb, PbS, PbSe, PbTe, or mixtures thereof.

Shells are formed on nanocrystals by introducing shell precursors at a temperature where material adds to the surface of existing nanocrystals but at which nucleation of new particles is rejected. In order to help suppress nucleation and anisotropic elaboration of the nanocrystals, selective ionic layer adhesion and reaction (SILAR) growth techniques can be applied. See, e.g., U.S. Pat. No. 7,767,260, which is incorporated by reference in its entirety. In the SILAR approach, metal and chalcogenide precursors are added separately, in an alternating fashion, in doses calculated to saturate the available binding sites on the nanocrystal surfaces, thus adding one-half monolayer with each dose. The goals of such an approach are to: (1) saturate available surface binding sites in each half-cycle in order to enforce isotropic shell growth; and (2) avoid the simultaneous presence of both precursors in solution so as to minimize the rate of homogenous nucleation of new nanoparticles of the shell material.

In the SILAR approach, it can be beneficial to select reagents that react cleanly and to completion at each step. In other words, the reagents selected should produce few or no reaction by-products, and substantially all of the reagent added should react to add shell material to the nanocrystals. Completion of the reaction can be favored by adding sub-stoichiometric amounts of the reagent. In other words, when less than one equivalent of the reagent is added, the likelihood of any unreacted starting material remaining is decreased.

Furthermore, the quality of core-shell nanocrystals produced (e.g., in terms of size monodispersity and QY) can be enhanced by using a constant and lower shell growth temperature than has been typically been used in the past. Alternatively, high temperatures may also be used. The techniques described here are amenable to a wide temperature range, unlike earlier SILAR methods that worked only at very high temperatures. In addition, a low-temperature or room temperature "hold" step can be used during the synthesis or purification of core materials prior to shell growth.

The outer surface of the nanocrystal can include a layer of compounds derived from the coordinating agent used during the growth process. The surface can be modified by repeated exposure to an excess of a competing coordinating group to form an overlayer. For example, a dispersion of the capped nanocrystal can be treated with a coordinating organic compound, such as pyridine, to produce crystals which disperse readily in pyridine, methanol, and aromatics but no longer disperse in aliphatic solvents. Such a surface exchange process can be carried out with any compound capable of coordinating to or bonding with the outer surface of the nanocrystal, including, for example, phosphines, thiols, amines and phosphates. The nanocrystal can be exposed to short chain polymers which exhibit an affinity for the surface and which terminate in a moiety having an affinity for a suspension or dispersion medium. Such affinity improves the stability of the suspension and discourages flocculation of the nanocrystal.

Monodentate alkyl phosphines (and phosphine oxides; the term phosphine below will refer to both) can passivate nanocrystals efficiently. When nanocrystals with conventional monodentate ligands are diluted or embedded in a non-passivating environment (i.e., one where no excess ligands are present), they tend to lose their high luminescence. Typical are an abrupt decay of luminescence, aggregation, and/or phase separation. In order to overcome these limitations, polydentate ligands can be used, such as a family of polydentate oligomerized phosphine ligands. The polydentate ligands show a high affinity between ligand and nanocrystal surface. In other words, they are stronger ligands, as is expected from the chelate effect of their polydentate characteristics.

In general, a ligand for a nanocrystal can include a first monomer unit including a first moiety having affinity for a surface of the nanocrystal, a second monomer unit including a second moiety having a high water solubility, and a third monomer unit including a third moiety having a selectively reactive functional group or a selectively binding functional group. In this context, a "monomer unit" is a portion of a polymer derived from a single molecule of a monomer. For example, a monomer unit of poly(ethylene) is —CH$_2$CH$_2$—, and a monomer unit of poly(propylene) is —CH$_2$CH(CH$_3$)—. A "monomer" refers to the compound itself, prior to polymerization, e.g., ethylene is a monomer of poly(ethylene) and propylene of poly(propylene).

A selectively reactive functional group is one that can form a covalent bond with a selected reagent under selected conditions. One example of a selectively reactive functional group is a primary amine, which can react with, for example, a succinimidyl ester in water to form an amide bond. A selectively binding functional group is a functional group that can form a noncovalent complex with a selective binding counterpart. Some well-known examples of selectively binding functional groups and their counterparts include biotin and streptavidin; a nucleic acid and a sequence-complementary nucleic acid; FK506 and FKBP; or an antibody and its corresponding antigen.

A moiety having high water solubility typically includes one or more ionized, ionizable, or hydrogen bonding groups, such as, for example, an amine, an alcohol, a carboxylic acid, an amide, an alkyl ether, a thiol, or other groups known in the art. Moieties that do not have high water solubility include, for example, hydrocarbyl groups such as alkyl groups or aryl groups, haloalkyl groups, and the like. High water solubility can be achieved by using multiple instances of a slightly soluble group: for example, diethyl ether is not highly water soluble, but a poly(ethylene glycol) having multiple instances of a —CH$_2$—O—CH$_2$— alkyl ether group can be highly water soluble.

For example, the ligand can include a polymer including a random copolymer. The random copolymer can be made using any method of polymerization, including cationic, anion, radical, metathesis or condensation polymerization, for example, living cationic polymerization, living anionic polymerization, ring opening metathesis polymerization, group transfer polymerization, free radical living polymerization, living Ziegler-Natta polymerization, or reversible addition fragmentation chain transfer (RAFT) polymerization.

EXAMPLES

Due to the highly reactive and toxic nature of many of the reactants, extreme care was and should be taken to exclude oxygen and water from the reaction mixtures; all procedures were performed on a Schlenk line.

Preparation of tris(trimethylsilyl)arsine is described in, for example, R. L. Wells, et al., *Inorganic Syntheses*, 31:150-158, 1997, which is incorporated by reference in its entirety. Preparations of tris(trimethylgermyl)stibine and tris(trimethylstannyl)stibine are described in, for example, M. Atesa, et al., *Phosphorus, Sulfur, and Silicon and the Related Elements*, 102:287-289, 1995, which is incorporated by reference in its entirety.

Tris(trimethylgermyl)arsine and tris(trimethylstannyl)arsine could be synthesized in a manner similar to that of tris(trimethylsilyl)arsine (see, e.g., E. Amberger and G Salazar, *Journal of Organometallic Chemistry*, 8:111-114, 1967, which is incorporated by reference in its entirety), but synthesizing a large quantity of tris(trimethylsilyl)arsine and then performing subsequent exchange of the trimethyl-IV groups was less expensive, faster, and safer.

The synthesis of tris(trimethylsilyl)arsine was performed according to the following scheme:

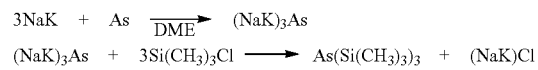

Following isolation and purification of tris(trimethylsilyl)arsine, synthesis of the of tris(trimethylgermyl)arsine was by exchange of trimethyl-IV groups:

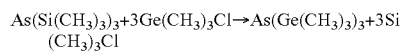

and analogously for synthesis of tris(trimethylstannyl)arsine:

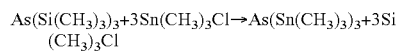

The synthesis of indium arsenide nanocrystals followed reported procedures, see Peter M. Allen, et al., *J. Am. Chem. Soc.*, 132(2):470-471, 2010, which is incorporated by reference in its entirety. The arsenide source was tris(trimethylsilyl)arsine, tris(trimethylgermyl)arsine, or tris(trimethylstannyl)arsine.

Synthesis of tris(trimethylsilyl)arsine. Using a procedure adapted from R. L. Wells, et al., *Inorganic Syntheses*, 31:150-158, 1997, which is incorporated by reference in its entirety, 220 mL of 1,2-dimethoxyethane (distilled over sodium-benzophenone), 10 g of sodium-potassium alloy and 7 g of arsenic were mixed in a nitrogen glovebox in a 500 mL three neck flask. Under vigorous argon purge, a mechanical stirrer and condenser were attached to the three neck flask. The solution was then heated to reflux and vigorously stirred for 24 hours. During this time, the solution turned black.

The solution was cooled to room temperature and under a vigorous flow of argon, an addition funnel was attached to the three neck flask. Then 38 g of trimethylsilylchloride (distilled over $CaH_2$) was added to the addition funnel via cannula and subsequently added to the solution dropwise. After the addition was complete, the solution was heated to reflux for another 16 hours. During this time the solution turned from black to grey, with precipitate clearly visible.

After standing at room temperature for 8 hours, the condenser and stirring rod were removed and replaced with a stopper and a Schlenk filter with a 500 mL Schlenk receiving flask. The apparatus was inverted and vacuum was applied periodically to the receiving flask in order to force the liquid through the filter.

The receiving flask was removed from the filter and the DME was removed by vacuum at room temperature. This left 20 mL of yellow/brown oily liquid. This was then purified by distillation under vacuum; yielding 12 g of tris(trimethylsilyl)arsine as a clear liquid (46% yield). See FIG. 1.

Synthesis of tris(trimethylgermyl)arsine and of tris(trimethylstannyl)arsine. To synthesize the tris(trimethylgermyl) arsine and tris(trimethylstannyl)arsine, the following procedures were adopted from M. Atesa, et al., *Phosphorus, Sulfur, and Silicon and the Related Elements*, 102:287-289, 1995; and H. Schumann, et al., J. Organometallic Chem. 222(2):217-225, 1981, each of which is incorporated by reference in its entirety.

For the preparation of tris(trimethylgermyl)arsine, 2.36 g of tris(trimethylsilyl)arsine (8 mmol) were mixed with 5.7 g of trimethylgermanium bromide (29 mmol). The solution was stirred at room temperature for 3 hours under argon. Then the solution was heated in an oil bath with temperature of 150° C. to distill off the trimethylgermanium bromide and to drive the reaction to completion. At this point the reaction mixture was an oily brown liquid with black solid precipitating on the side of the flask. The product was purified by distillation under vacuum. $^1$H NMR showed a singlet at 0.47 ppm referenced to toluene. See FIG. 1.

For the preparation of tris(trimethylstannyl)arsine, 2.95 g of tris(trimethylsilyl)arsine and 6.98 g of trimethyltin chloride were mixed in a round bottom flask under argon. The solution was stirred for 3 hours and then evacuated to remove trimethyltin chloride before vacuum distilling the product. $^1$H NMR showed a triplet (due to coupling with Sn) at 0.34 ppm referenced to toluene. See FIG. 1.

Synthesis of tris(trimethylsilyl)stibine. This synthesis was adapted from Becker et al., In W A Herrmann and H H Karsch, eds., *Synthetic Methods of Organometallic and Inorganic Chemistry*, Thieme, which is incorporated by reference in its entirety. It proceeded identically to the synthesis of tris(trimethylsilyl)arsine described above, with the following modications:

1. The amounts involved were 19 g NaK, 22 g antimony powder, 67 g trimethylsilyl chloride, and 800 mL DME.
2. The NaK was added slowly (to maximize the formation of small droplets and thus maximize surface area).
3. The NaK and antimony were allowed to reflux for four days.

4. After removing most of the DME by vacuum, the product was not distilled all at once, to minimize the risk of thermal decomposition. Instead, small amounts were distilled in a Hickmann still as needed.

Figure 2:
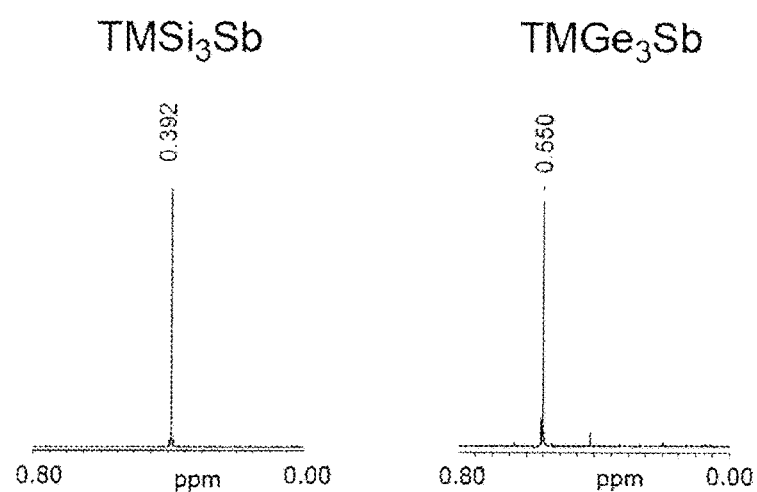
FIG. 2 shows $^1$H NMR spectra of stibine nanocrystal precursors.

$^1$H NMR showed one singlet at 0.392 ppm. See FIG. 2.

Synthesis of tris(trimethylgermyl)stibine. This synthesis was adapted from M. Atesa, et al., *Phosphorus, Sulfur, and Silicon and the Related Elements*, 102:287-289, 1995; which is incorporated by reference in its entirety. 5 g of trimethylgermyl chloride and 3.7 g of impure tris(trimethylsilyl) stibene (65% wt in DME) were mixed in a round bottom flask under argon. The solution was stirred for 20 minutes and then heated in an oil bath (bath temperature was gradually increased to 135° C.) to remove trimethylgermyl chloride before vacuum distilling the product. $^1$H NMR showed one singlet at 0.550 ppm. See FIG. 2.

Example 1

Synthesis of InAs Nanocrystals. In a typical synthesis, a solution of tris(trimethylsilyl)arsine, tris(trimethylgermyl) arsine, or tris(trimethylstannyl)arsine in n-trioctylphosphine (TOP) was swiftly injected into a solution of indium(III) myristate in 1-octadecene at 150° C. The temperature was subsequently raised to 250° C. for growth of nanocrystals.

Figures 3A, 3B:
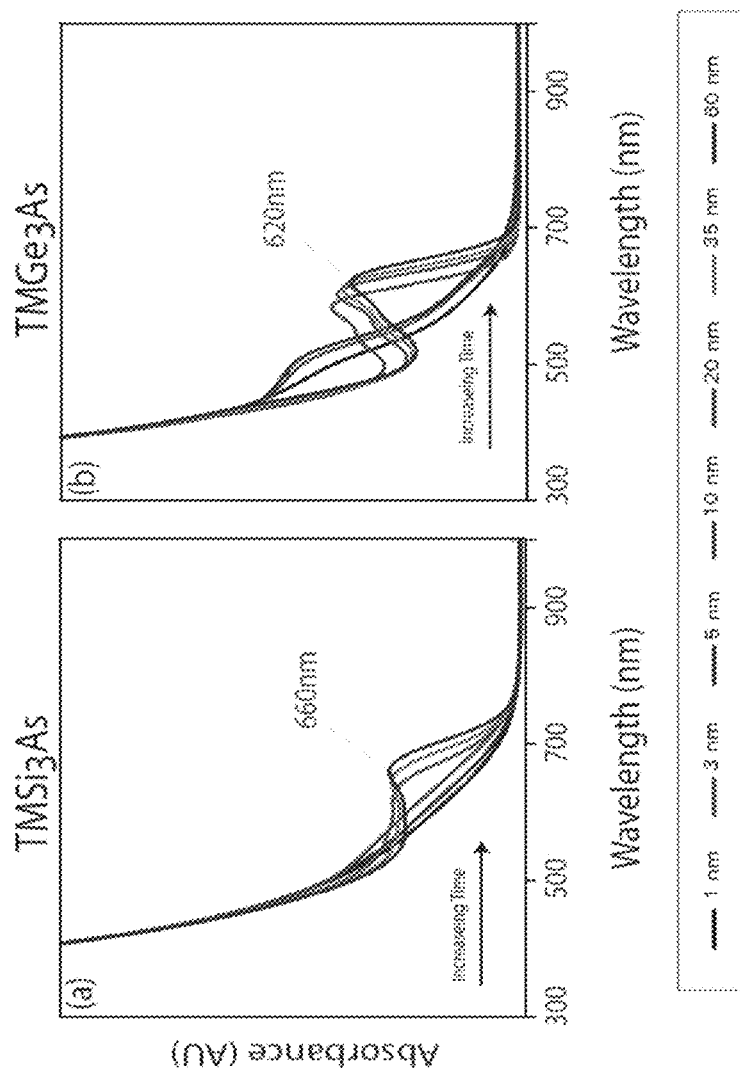
FIGS. 3A-3C show absorbance spectra of InAs nanocrystals prepared with tris(trimethylsilyl)arsine (FIG. 3A); tris(trimethylgermyl)arsine (FIG. 3B); or tris(trimethylstannyl)arsine (FIG. 3C).
Figure 3C:
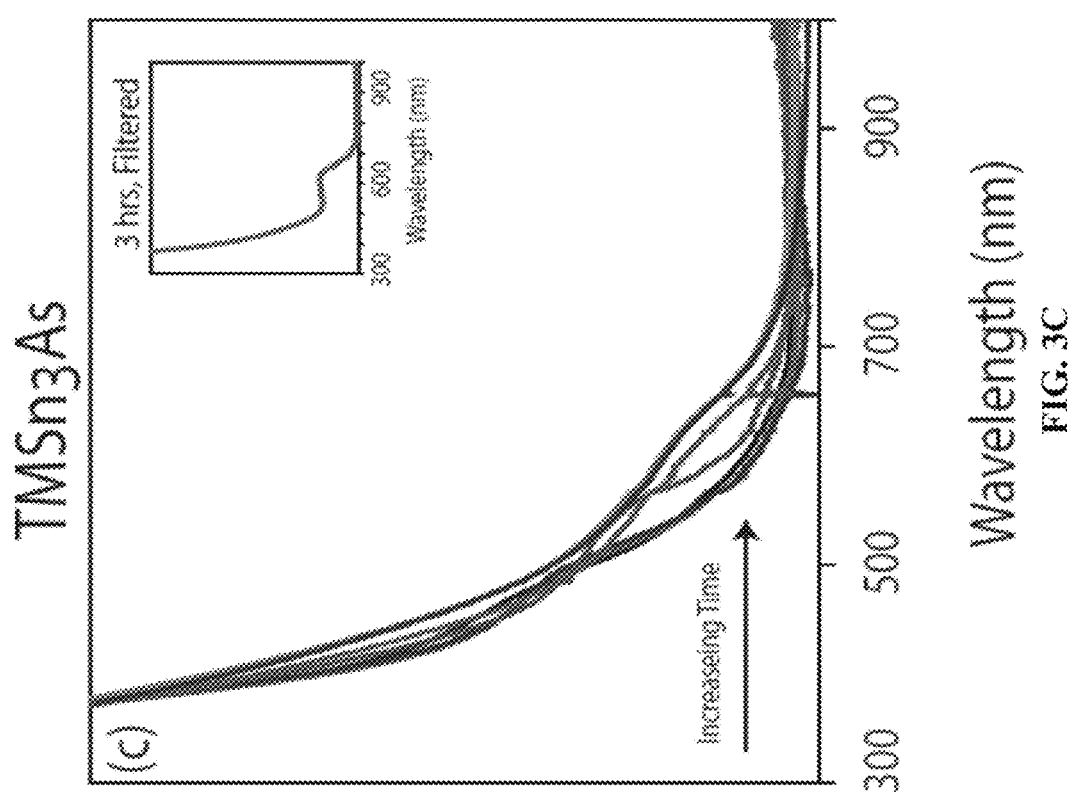

The nanocrystals prepared from the different precursors had markedly different spectra (FIGS. 3A-3C). A more nearly monodisperse sample has better defined absorption features than a more polydisperse sample, due to a decreased degree of inhomogeneous broadening. Accordingly, absorption peak definition can be used as a guide to the size distribution of a nanocrystal population. Inspection of the spectra showed that nanocrystals synthesized from tri(trimethylgermyl)arsine were both smaller and had a narrower size distribution than those synthesized from tris(trimethylsilyl)arsine. It was apparent that the growth kinetics using different precursors were different based on the location of the peak absorption feature and the definition of this feature. See (FIGS. 3A-3C), which shows absorption spectra from three reactions using identical conditions with different arsenic precursors. FIG. 3A, tris(trimethylsilyl)arsine; FIG. 3B, tris(trimethylgermyl)arsine; FIG. 3C, tris(trimethylstannyl)arsine. The inset of (c) shows the absorption spectrum of InAs nanocrystals synthesized from tris(trimethylstannyl) arsine after 3 hrs with filtration to remove insoluble precipitates.

Figure 4:
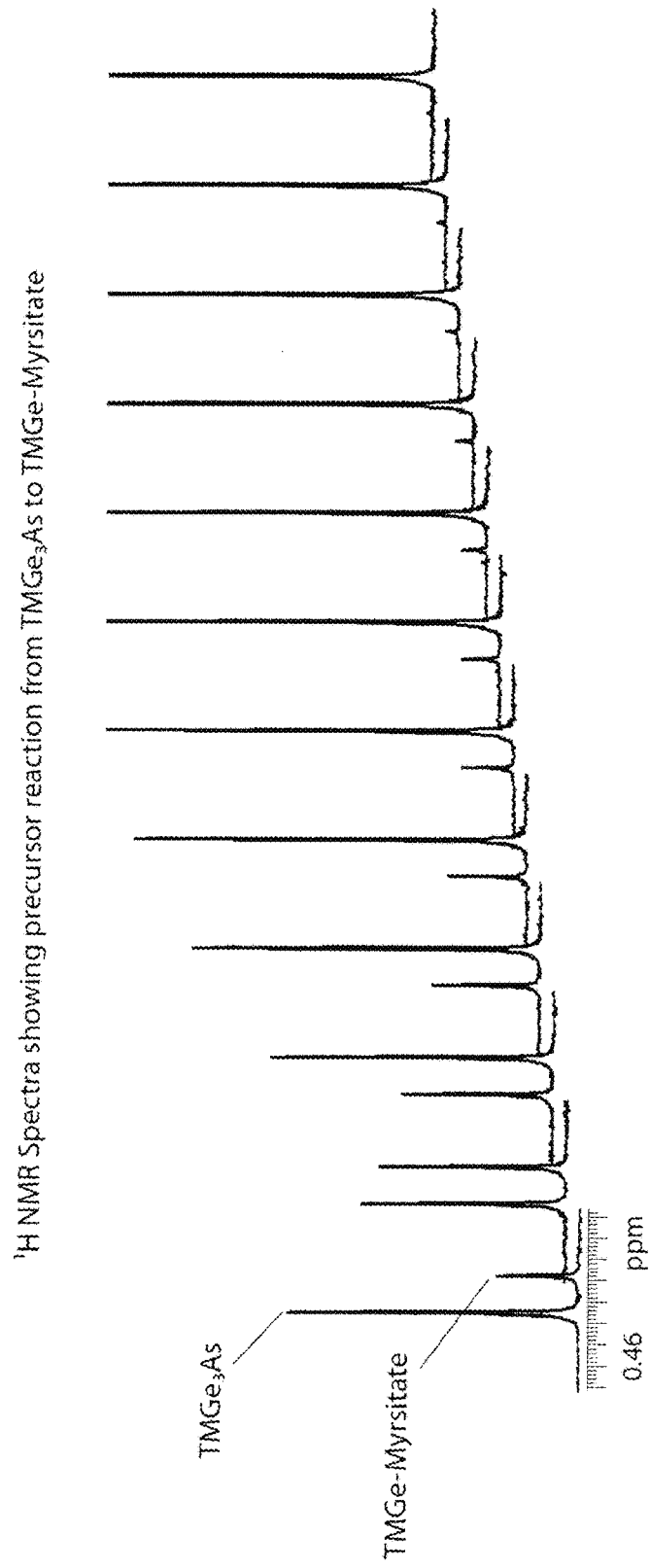
FIG. 4 shows a time series of $^1$H NMR spectra.

The rapid, high temperature reaction makes direct study of reaction kinetics difficult. However, the growth kinetics can be monitored at a series of temperatures using variable temperature NMR. In this way, the thermodynamic properties associated with the chemical reaction (e.g., $\Delta H$ and $\Delta S$) can be determined. By tracing the peak intensity (or integrated area) as a function of time (see FIG. 4), the reaction can be monitored in the NMR tube and the reaction rate determined quantitatively.

Figure 5:
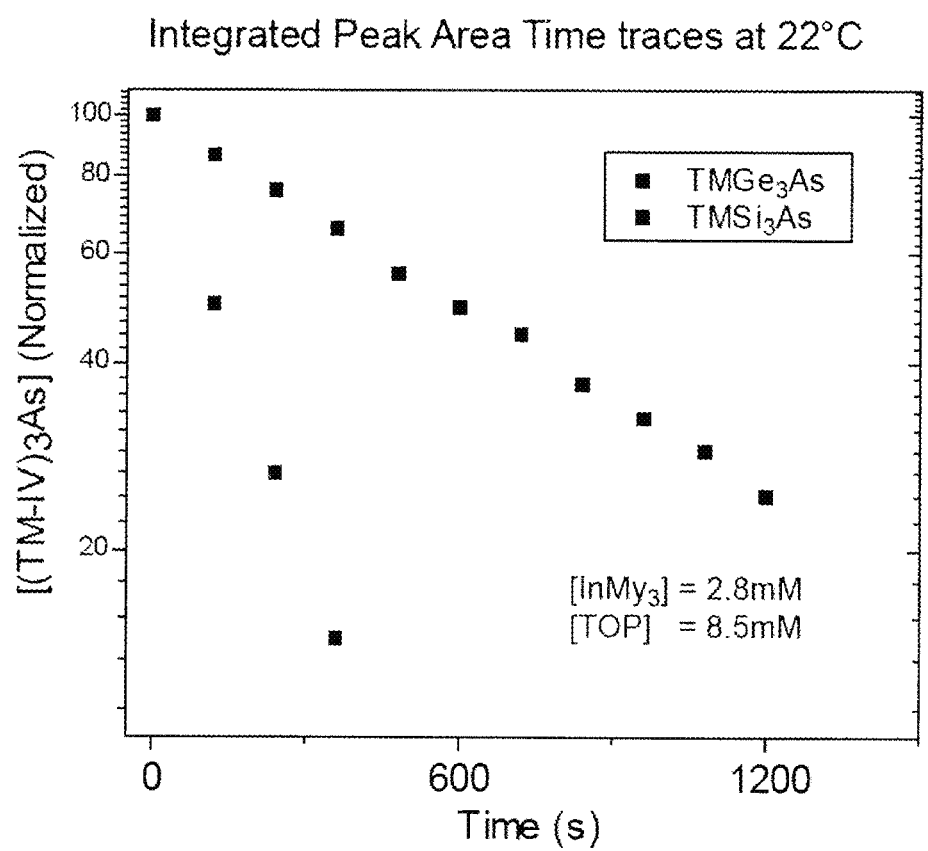
FIG. 5 is a graph illustrating the kinetics of the reaction of different tris(trimethyl)-group IV compounds with indium (III) myristate.
Figures 6A, 6B, 6C, 6D:
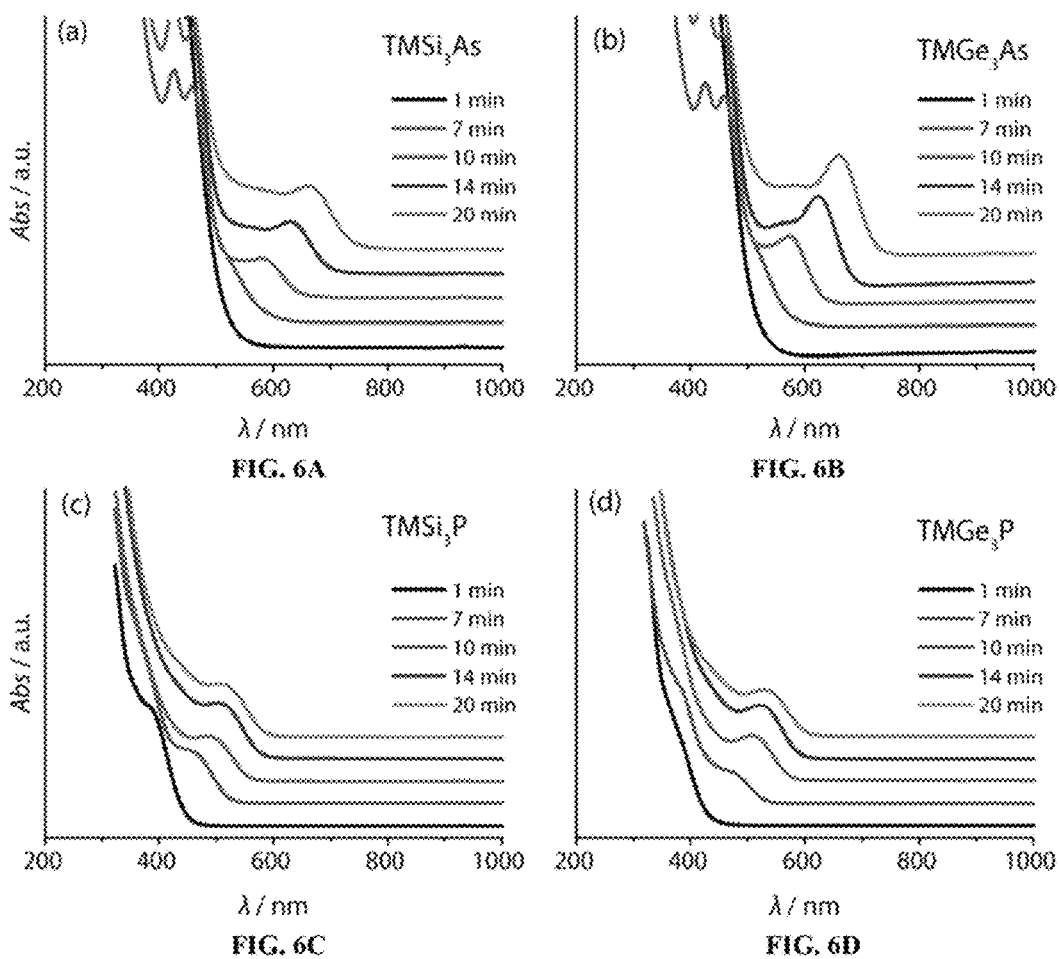
FIGS. 6a-6d show absorption spectra of aliquots taken during growth of InAs (FIGS. 6a, 6b) and InP (FIGS. 6c, 6d) using the silyl-V precursor (FIG. 6a, FIG. 6c) and the germyl-V precursor (FIG. 6b, FIG. 6d).

Results for the reaction of tris(trimethylgermyl)arsine and tris(trimethylsilyl)arsine with indium (III) myrsitate (InMy$_3$) are shown in FIG. 5. These data show that, at room temperature, the reaction with tris(trimethylsilyl)arsine was much faster. If the reaction at temperatures used in nanocrystal synthesis of is also faster for the silyl precursor than for the germyl precursor, then the sizes of the two samples shown in FIG. 3 contradict general theoretical predictions and observations specific to the synthesis of cadmium selenide nanocrystals about the effect of precursor conversion rate on particle size. See, e.g., Jane Y Rempel et al., *J. Am. Chem. Soc.*, 131(12):4479-89, 2009; Flurin Hänseler. PhD thesis, MIT & ETH Zurich, 2011; and Jonathan S. Owen, et al., *J. Am. Chem. Soc.*, 132(51):18206-13, 2010; each of which is incorporated by reference in its entirety.

Example 2

Synthesis of Nanocrystals. Nanocrystals were prepared by reaction with indium(III) myristate ($InMy_3$) using the different group-V sources under otherwise identical conditions: a modified version of previously reported procedures (P. M. Allen, et al., *J. Am. Chem. Soc.* 2010, 132, 470-1; and D. Battaglia, X. Peng, *Nano Letters* 2002, 2, 1027-1030, each of which is incorporated by reference in its entirety). 0.3 mmoles (240 mg) of indium myristate were placed in a three neck round bottom flask (25 mL). 4 mL of 1-octadecene were added, and the resulting mixture was heated under vacuum, turning clear before reaching 100° C. After degassing to a pressure of <100 mtorr at 100° C., the solution was then placed under argon and heated to 130° C. In a nitrogen glovebox, 0.15 mmoles $TME_3V$ (tris(trimethyl)E-V, where E=Si, Ge, or Sn and V=P or As) were mixed into 1 mL of tri-n-octylphosphine (Strem, 97%), and rapidly injected into the solution with magnetic stirring at 1150 rpm. Two minutes after injection, the temperature controller was increased to 210° C. Aliquots were removed and their absorption spectra measured throughout the nanocrystal growth. The system was removed from heat after 20 minutes. Aliquots were removed from the growth solution and characterized by measuring absorbance spectra (FIGS. 6a-6d). In order to ensure that the results were as comparable as possible, all experimental parameters were kept the same (stirring rate, flask size, etc). The absorption spectra for the aliquots from the indium phosphide solutions prepared using $TMGe_3P$ and $TMSi_3P$ were similar (the absorption peak from the $TMGe_3P$ sample was slightly better defined), however the absorption spectra from the aliquots from the indium arsenide solutions prepared from $TMGe_3As$ showed significantly better defined features than those prepared from $TMSi_3As$ (the HWHM of nanocrystals prepared from $TMGe_3As$ was 37 nm vs. 45 nm for $TMSi_3As$, a 21% difference). The sharp features in the absorption spectrum were an indication of a narrow particle size distribution, suggesting that the indium arsenide particles prepared from $TMGe_3As$ were more monodisperse than those prepared from the $TMSi_3As$. Attempting the same synthesis using $TMSn_3P$ and $TMSn_3As$ did not produce nanocrystal samples with absorption features.

Figures 7A, 7B, 7C, 7D:
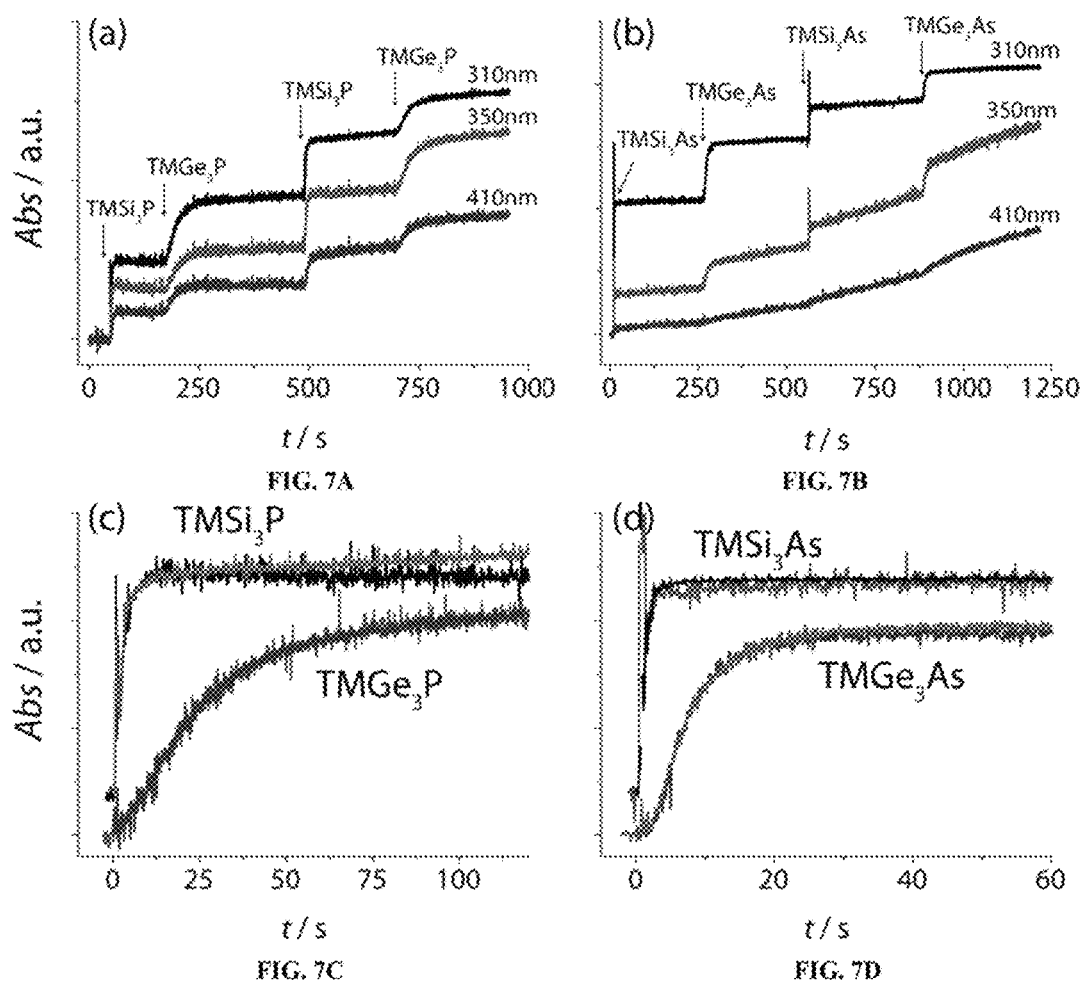
FIGS. 7a-7d show absorbance traces during precursor injection at 130° C. for InP (FIG. 7a) and InAs (FIG. 7b). The injection of silyl-V and germyl-V precursor was alternated so that the absorbance rise could be directly compared. The absorbance rise at 310 nm (from FIGS. 7a, 7b) was normalized truncated, and adjusted so that each injection was plotted with t=0 (FIGS. 7c, 7d). The TMSi$_3$V precursor injections in c and d are offset for clarity.

During synthesis, the color change upon injection of group-V precursor seemed to occur smoothly over several seconds for the $TMGe_3V$ precursors, while nearly instantaneously for the $TMSi_3V$ precursors. To quantify this observation, an absorption dip probe was used to measure the rise in absorbance after precursor injection at 130° C., the injection temperature used for nanocrystal growth in FIGS. 6a-6d. Previous experiments have indicated that the extinction coefficient of quantum dots in the UV region scales with particle volume (C. A. Leatherdale, et al., J. Phys. Chem. B 2002, 106, 7619-7622, which is incorporated by reference in its entirety). Thus, absorbance at 310 nm was used to monitor the formation of InAs and InP clusters (FIGS. 7a-7b). Although the absorbance in the UV rose quickly, the particles did not show absorption features without heating at elevated temperature. In order to directly compare the rate of absorbance rise upon injection of the two different precursors, a large excess of indium(III) myristate was used and the $TMGe_3As$ and $TMSi_3As$ solutions were injected alternately. This eliminated any source of error from variations in concentration. The absorbance rise appeared to be insensitive to when in the injection sequence they occurred. When the absorbance traces were normalized by the intensity change and overlaid for comparison, the two traces for each precursor were nearly identical (FIGS. 7c-7d). These results clearly showed that particle formation occurred more slowly for the $TMGe_3V$ precursors than for the $TMSi_3V$ precursors. In fact, the absorbance rise for the $TMSi_3V$-based precursor occurred on a timescale that was competitive with the time required for mixing. Although these data clearly showed that the absorbance rise was much slower for the $TMGe_3V$ precursors than for the $TMSi_3V$ precursors, the data were difficult to directly attribute to molecular precursor conversion. To compare the rates of molecular precursor conversion, NMR spectroscopy was used to monitor the evolution of precursor concentration in time.

Figure 9B:
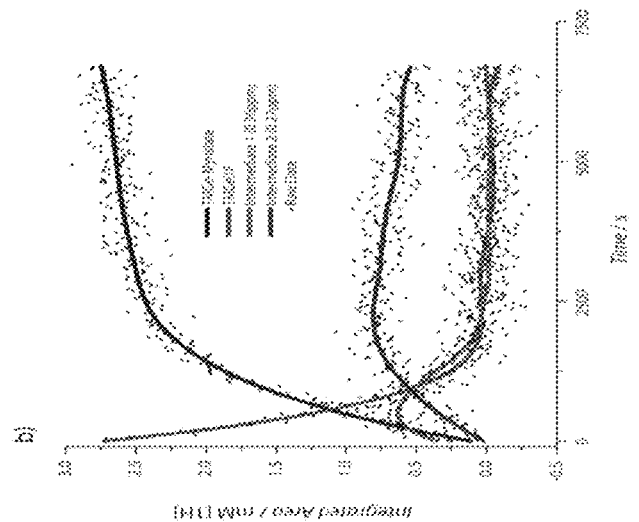
FIGS. 9a and 9b show $^1$H NMR spectra showing the evolution of precursor concentration as well as two intermediates for the reaction of TMGe$_3$P with InMy$_3$. The reaction solution was 3 mM InMy$_3$.
Figure 9A:
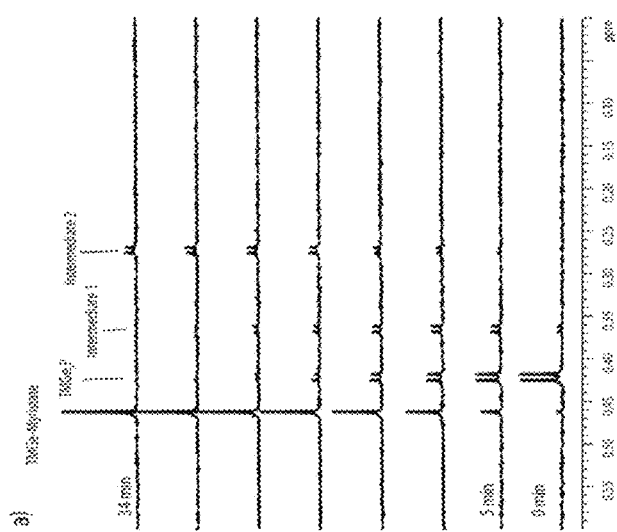

An NMR tube was loaded with $InMy_3$ and tri-n-octylphosphine (TOP). Just before the NMR tube was inserted into the instrument, a solution containing both group-V precursors was injected. A time series of NMR spectra (FIG. 8a) showed that the $TMSi_3P$ peak disappeared much faster than the $TMGe_3P$ peak. The reaction was performed under pseudo-first order conditions, where the concentration of indium was >10× that of the phosphorous and arsenic. Exponential fits to the data indicated that under these conditions the reaction rate of $TMSi_3P$ was more than 4× faster than the reaction rate of $TMGe_3P$. The concentration of $TME_3P$ over time was consistent with a reaction with first order dependence on phosphorous precursor (FIG. 8b). An intermediate was observed (FIG. 8a) that was believed to be similar to that reported for the reaction of $InMy_3$ with $TMSi_3P$ in the presence of amines (P. M. Allen, B. J. Walker, M. G. Bawendi, *Angew. Chem., Int. Ed.* 2010, 49, 760-2, which is incorporated by reference in its entirety). This intermediate peak was observed to be present when the $TMGe_3P$ precursor was allowed to react without the presence of the $TMSi_3P$ precursor, and a second intermediate was also observed (FIGS. 9a and 9b). The second intermediate occurred at 0.28 ppm and was obscured by the presence of TMSi-Myristate in FIG. 8a.

A similar experiment was performed with the two arsenic precursors. However the reaction rate of $TMSi_3As$ was too fast to observe, as no $TMSi_3As$ remained after the NMR tube containing the reaction mixture had been inserted into the NMR spectrometer and the instrument prepared for acquisition. However, the reaction of $TMGe_3As$ was readily observed to proceed from $TMGe_3As$ to TMGe-myristate. By assuming that the height of any remaining $TMSi_3As$ peak in the NMR spectrum was less than the level of the noise, and because the time between precursor mixing and the acquisition of the first spectrum was <1.5 minutes, it was inferred that the rate constant for the reaction of $TMSi_3As$ was at least 30× faster than the reaction rate of $TMGe_3As$ under the same conditions. The reaction rate could also be slowed by increasing the concentration of TOP, an effect similar to that observed previously with indium phosphide and octylamine. In order to further characterize the reaction between $InMy_3$ and $TMGe_3As$, the concentration of $InMy_3$ was varied and the reaction order in indium was determined to be second order. This result differed from the reaction order determined by observing the absorption rise times with varying concentrations of indium at 130° C. The discrepancy between the reaction order observed using these two sets of conditions points to a chemical mechanism that is sensitive to changes in temperature, TOP concentration, or both.

Other embodiments are within the scope of the following claims.

What is claimed is:

1. A method of making a semiconductor nanocrystal, comprising:
    contacting an M-containing compound with an X donor, wherein the X donor has formula (I):

$X(Y(R)_3)_3$         (I)

wherein
    X is P;
    Y is Pb; and
    each R, independently, is alkyl, alkenyl, alkynyl, cycloalkyl, cycloalkenyl, heterocyclyl, aryl, or heteroaryl, wherein each R, independently, is optionally substituted by 1 to 6 substituents independently selected from hydrogen, halo, hydroxy, nitro, cyano, amino, alkyl, cycloalkyl, cycloalkenyl, alkoxy, acyl, thio, thioalkyl, alkenyl, alkynyl, cycloalkenyl, heterocyclyl, aryl, or heteroaryl.

2. The method of claim 1, wherein each R, independently, is alkyl, cycloalkyl, or aryl.

3. The method of claim 1, wherein each R, independently, is unsubstituted alkyl, unsubstituted cycloalkyl, or unsubstituted aryl.

4. The method of claim 1, wherein the M-containing compound is an M-containing salt.

5. The method of claim 1, wherein M is a group III element.

6. The method of claim 1, wherein M is In.

7. The method of claim 1, wherein the compound of formula (I) is tris(trimethylplumbyl) phosphide.

8. A method of making a semiconductor nanocrystal, comprising:
    contacting an M-containing salt with an X donor, wherein the X donor has formula (I):

$X(Y(R)_3)_3$         (I)

wherein
    X is P;
    Y is Pb;
    each R, independently, is unsubstituted alkyl or unsubstituted cycloalkyl; and
    M is a group III element.

* * * * *